United States Patent [19]
Kawamoto

[11] Patent Number: 5,522,520
[45] Date of Patent: Jun. 4, 1996

[54] METHOD FOR FORMING AN INTERCONNECTION IN A SEMICONDUCTOR DEVICE

[75] Inventor: Hideaki Kawamoto, Tokyo, Japan

[73] Assignee: NEC Corporation, Tokyo, Japan

[21] Appl. No.: 388,455

[22] Filed: Feb. 14, 1995

[30] Foreign Application Priority Data

Feb. 15, 1994 [JP] Japan ................. 6-18728

[51] Int. Cl.⁶ .................. C03C 15/00; C03C 25/06; B05D 3/02
[52] U.S. Cl. .................. 216/62; 156/643.1; 156/656.1; 148/212; 427/383.3; 437/228
[58] Field of Search .................. 216/62; 156/656.1, 156/643.1; 148/212; 427/383.3; 437/228

[56] References Cited

U.S. PATENT DOCUMENTS 3,585,091  6/1971  Lepselter ................. 216/62

FOREIGN PATENT DOCUMENTS 4-251923  9/1992  Japan.

*Primary Examiner*—Richard L. Schilling
*Attorney, Agent, or Firm*—Young & Thompson

[57] ABSTRACT

An interconnection in a semiconductor device is made of a conductive laminate including a Ti film, a TiN film and an aluminium alloy film consecutively formed on a $SiO_2$ film grown on a Si substrate. A heat treatment of the conductive layer is performed at 450°–600° C. before plasma-etching to introduce nitrogen and oxygen atoms from TiN film and $SiO_2$ film, respectively, into the Ti film. The nitrogen and oxygen atoms prevent the side-etching of the Ti film during a plasma etching of the laminate using a plasma containing chlorine atoms. An interconnection having a high reliability is obtained with a high productivity.

10 Claims, 5 Drawing Sheets

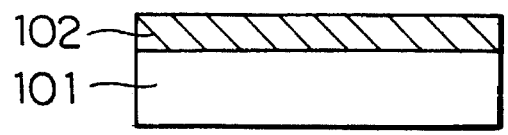
FIG. IA
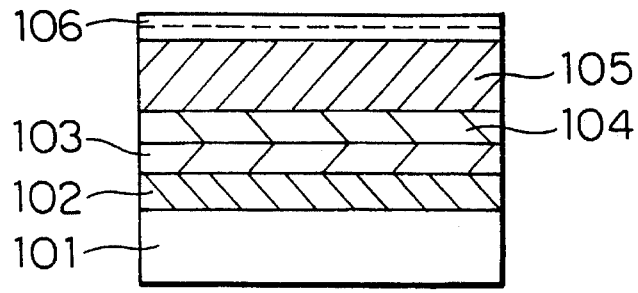
FIG. IB
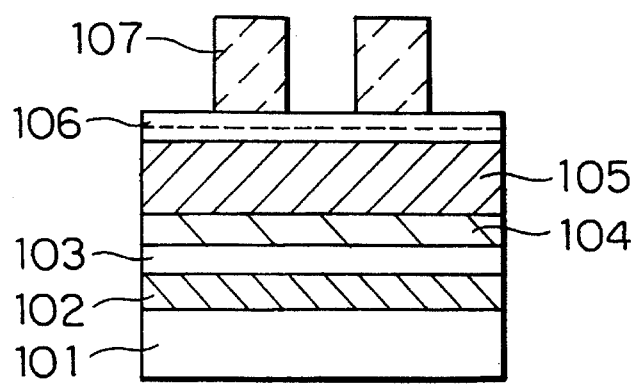
FIG. IC
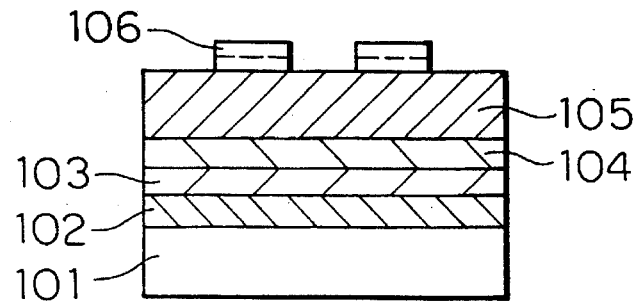
FIG. ID
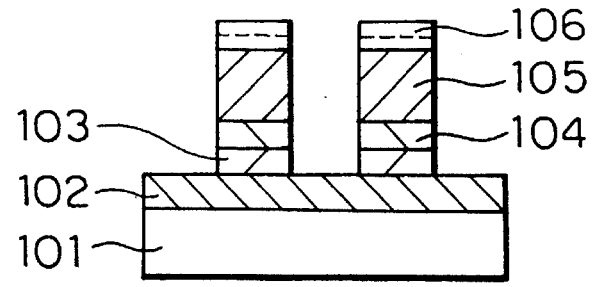
FIG. IE

METHOD FOR FORMING AN INTERCONNECTION IN A SEMICONDUCTOR DEVICE

BACKGROUND OF THE INVENTION (a) Field of the Invention

The present invention relates to a method for forming an interconnection in a semiconductor device and, more particularly, to a method for forming an interconnction having a predetermined pattern in a semiconductor device by patterning a conductive laminate including a titanium (Ti) film and a titanium nitride (TiN) film in direct contact with each other.

(b) Description of the Related Art

A laminate structure including a Ti film and a TiN film or including those films together with another metallic film has widely been utilized for forming either an interconnection or a contact electrode in a semiconductor device. A dry etching technology employing a mixture of oxygen and at least one of fluorinated hydrocarbon gases and fluorochlorinated hydrocarbon gases as an etchant gas source for a Ti film has been reported in a literature, for instance, Publication No. JP-A-92-251923.

In the publication mentioned above, it is intended to provide a method for forming either an interconnection or an contact electrode having an excellently shaped pattern.

SUMMARY OF THE INVENTION

It is an object of the present invention to provide another method for forming an interconnection or a contact electrode with an excellent etch-rate suitable for IC production wherein a resultant pattern has a precise dimension.

According to the present invention, there is provided a method for manufacturing an interconnection in a semiconductor device including steps of: forming a conductive laminate overlying a substrate and including a Ti film and a TiN film in direct contact with each other; annealing the conductive laminate to introduce at least nitrogen atoms from the TiN film to the Ti film; and dry-etching the conductive laminate after the annealing.

To make the interconnection technology according to the present invention more effective, it is preferable that the heat treatment is performed at a temperature not lower than about 450° C. and that the conductive layer mentioned above includes one of an aluminium (Al) film and an Al alloy film beside above-mentioned Ti and TiN laminate. On an occasion that the aforesaid heat treatment is carried out after forming the Al or Al alloy film, it is preferred to select a temperature ranging between 450° and 600° C. for the heat treatment mentioned above.

It is more preferable that the method according to the present invention further includes a step for forming an oxide film contacted with the aforesaid Ti film prior to the heat treatment mentioned above.

The nitrogen atoms diffused out of the TiN film into the Ti film during the heat treatment according to the present invention prevent the side-etching during a step for forming the interconnection pattern from the conductive layer by use of plasma-etching in the gases including chlorine atoms.

On an occasion that the method according to the present invention further includes a step for forming a silicon dioxide ($SiO_2$) film contacted with the Ti film prior to the heat treatment, co-existing oxygen atoms introduced from the oxide film into the Ti film prevent the side-etch more effectively than on an occasion that only the nitrogen atoms exist.

BRIEF DESCRIPTION OF THE DRAWINGS

The above and other objects, features and advantages of tile present invention will be more apparent from the following description, taking in conjunction with accompanying drawings in which:

FIGS. 1A–1E are cross-sectional views of a semiconductor device in consecutive steps of a method for forming an interconnection according to a first embodiment of the present invention;

DESCRIPTION OF THE PREFERRED EMBODIMENTS

Figure 2:
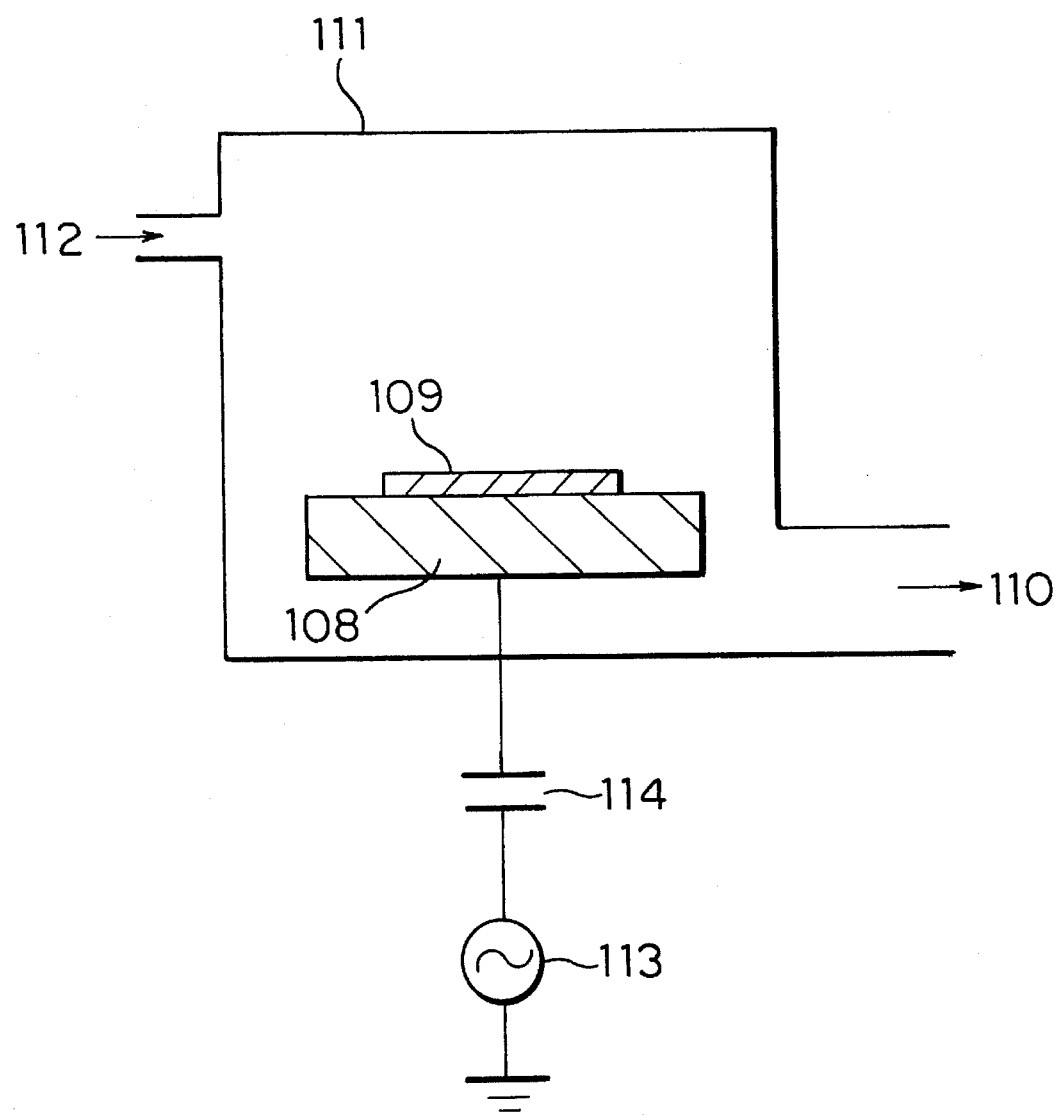
FIG. 2 is a schematic side view of an RIE (Reactive Ion Etching) process used in the step for forming the interconnection pattern shown in FIGS. 1A–1E.

Before describing preferred embodiments according to the present invention, problems and disadvantages involved in the conventional methods will be described for a better understanding of the present invention.

In the conventional method to etch a Ti film using one of the mixed gases described before as a reaction gas, when a conductive film has a laminate structure composed of a Ti film and an Al alloy film, it is necessary to change a gas composition in the reaction gas just at the interface between the Al alloy film and the Ti film. As a result, the process sequence is complicated while process conditions are strictly limited to within a narrow allowance.

Furthermore, Ti atoms etched by the mixed gas described above usually evaporate as Ti fluoride compounds. Hence, it arises another problem that vapor pressures of the Ti fluoride compounds are not very high so that none of a high etch rate, a precise dimension of the resultant pattern and a high etch-selectivity to a mask can be obtained.

Now, preferred embodiments of the present invention will be described with reference to drawings.

FIGS. 1A–1E illustrate a first embodiment of the present invention. As shown in FIG. 1A, a $SiO_2$ film 102 having a thickness of about 5000 angstrom (A) is formed on a semiconductor substrate 101 employing a thermal oxidation technology. Next, a Ti film 103 is formed to a thickness of about 1000 A by a sputter-deposition technology.

Subsequently, an about 1000 A-thick TiN film 104 is formed employing a reactive sputtering technology. Then, an Al-copper (Al—Cu) alloy Film 105 is sputter-deposited to a thickness of about 1 μm. Subsequently, another $SiO_2$ film 106 is formed to a thickness of about 2000 A employing a plasma-enhanced chemical vapor deposition (PE-CVD) technology as shown in FIG. 1B. During the step for forming the oxide film 106, the main surface of the substrate 101 is kept at about 450° C. by a heat treatment of the substrate 101. Such a heat treatment of the substrate 101 as performed during the PE-CVD step induces diffusion of nitrogen atoms out of the overlying TiN film 104 as well as diffusion of oxygen atoms out of the underlying thermally grown oxide film 102, introducing both of them into the Ti film 103 intervening therebetween. Consequently, a conductive Ti film 103 is obtained which contains both nitrogen and oxygen atoms migrated by the thermal diffusion.

FIG. 1C illustrates the semiconductor device during a step for patterning the oxide film 106. A photoresist film having a thickness of about 1 μm is coated first on the abovementioned SiO$_2$ film 106, then patterned by a photolithographic step to form a photoresist pattern 107. Subsequently, the oxide film 106 is etched using the photoresist pattern 107 as a mask. This etching step is performed in reactive ion etching (RIE) equipment.

FIG. 2 shows a schematic side view off a typical etching reaction mechanism proceeded in the RIE equipment. Firstly, a piece off silicon (Si) wafer 109 is placed on a wafer stage 108. Next, a reaction chamber 111 enclosing the etching equipment is evacuated enough through an evacuation exhaust 110. Then, an ambient pressure in the chamber 111 is controlled to be about 100 mTorr by introducing through a gas inlet 112 a mixed gas including a carbon tetrafluoride (CF$_4$) vapor and a fluoroform (CHF$_3$) vapor of 50:50 in flow rate at a standard cubic centimeter (sscm)/ mimute. Subsequently, an RF power of 13.56 MHz in frequency is supplied from an oscillator 113 through a blocking capacitor 114 to the wafer stage 108. The RF power generates a plasma sheath in the etching chamber 111. The resultant plasma etches the oxide film 106 and provides a structure as shown in FIG. 1D after removal of the photoresist pattern 107.

Subsequently, a bundle etching of the Al—Cu/TiN/Ti laminate films is carried out using the oxide pattern 106 as a mask in the RIE equipment shown in FIG. 2. The etching gas used is a mixed gas composed of chlorine gas and nitrogen gas in flow rate of 50:10 (sccm) while an ambient pressure in the chamber is kept at 80 mTorr. An RF input power supplied through an automated impedance matching apparatus is about 300 W. The Al—Cu film 105 is readily etched off because the Al—Cu film 105 reacts with active chlorine ions in the plasma to form a volatile compound such as aluminium trichloride (AlCl$_3$) while the Ti 103/TIN 104 films are also readily etched off because they form another volatile compound such as titanium tetra-chloride (TiCl$_4$).

FIG. 1E illustrates resultant profiles of the etched patterns described above. Superior sidewall profiles are obtained because the nitrogen and oxygen atoms introduced into Ti film 103 by the heat treatment during the PE-CVD growth of oxide film 106 suppresses the side-etching of Ti film 103.

Now, a second embodiment of the present invention will be described with reference to FIGS. 3A–3E each illustrating another semiconductor device in consecutive steps of fabrication therefor.

Figure 3A:
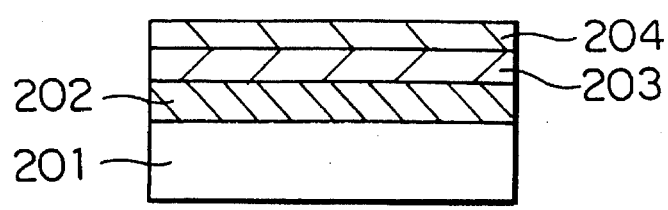
FIGS. 3A–3E are cross-sectional views of a semiconductor device in consecutive steps of a method for forming an interconnection according to a second embodiment of the present invention.
Figure 3B:
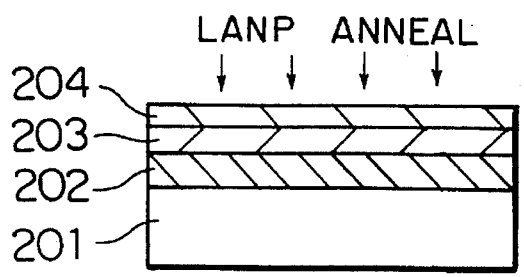

As shown in FIG. 3A, a SiO$_2$ film 202 is first formed on a Si substrate 201 to a thickness of about 5000 A using a thermal oxidation technology. Next, a Ti film 203 is formed to a thickness of 1000 A by a sputter-deposition technology, following which a reactive sputter-deposition step is performed to obtain a TiN film 204 having a thickness of about 1000 A. FIG. 3B illustrates a subsequent heat treatment carried out at a temperature of about 600° C. for a minute using a lamp annealing apparatus. The heat treatment induces diffusion of nitrogen atoms out of TiN film 204 as well as diffusion of oxygen atoms out of oxide film 202, introducing both atoms into Ti film 203 intervening therebetween. As a result, the conductive Ti film 203 is formed containing both nitrogen and oxygen atoms.

Figure 3C:
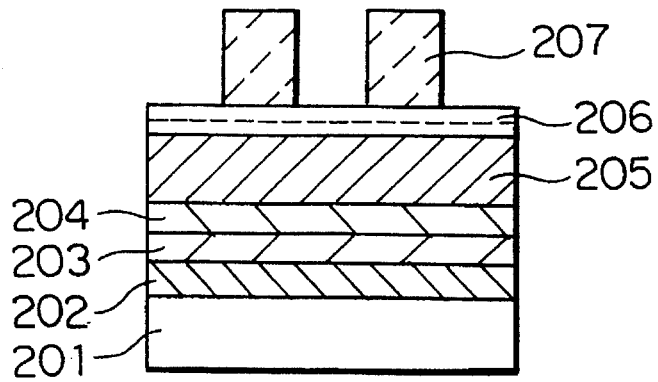
Figure 3D:
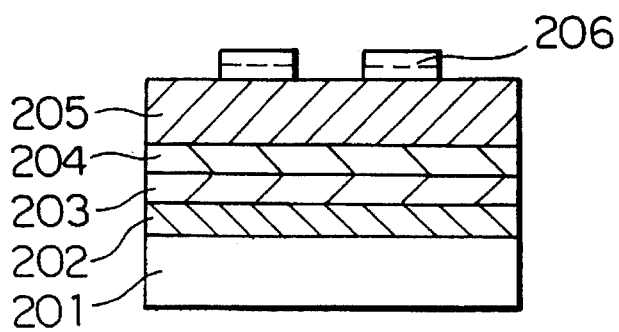

An Al—Si—Cu film 205 is then sputter-deposited on the TiN film 204. Then, a SiO$_2$ film 206 is formed to a thickness of about 2000 A using a PE-CVD technology. During the PE-CVD step, the main surface of the Si substrate 201 is kept at 300° C. Thereafter, a photoresist film is coated, then patterned to form a photoresist pattern 207 by a photolithographic technology as shown in FIG. 3C. The oxide film 206 is then etched in RIE equipment using the photoresist pattern 207 as a mask. Removal of the photoresist pattern 207 provides a structure shown in FIG. 3D.

Figure 3E:
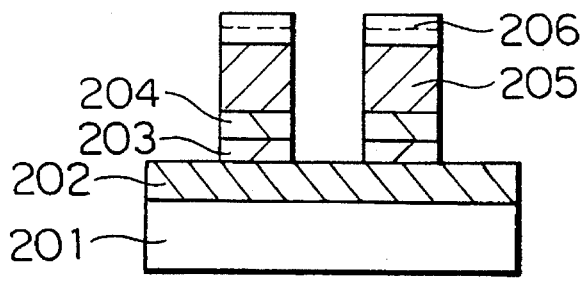

Subsequently, a bundle etching of a laminate conductive layer made of Al—Si—Cu/TiN/Ti films is also performed in RIE equipment shown in FIG. 2 using the oxide pattern 206 as a mask. FIG. 3E illustrates a side-view of bundle-etched patterns. Excellently shaped pattern profiles are obtained because the nitrogen and oxygen atoms introduced into Ti film 203 suppresses side-etching of Ti film 203.

Figure 4:
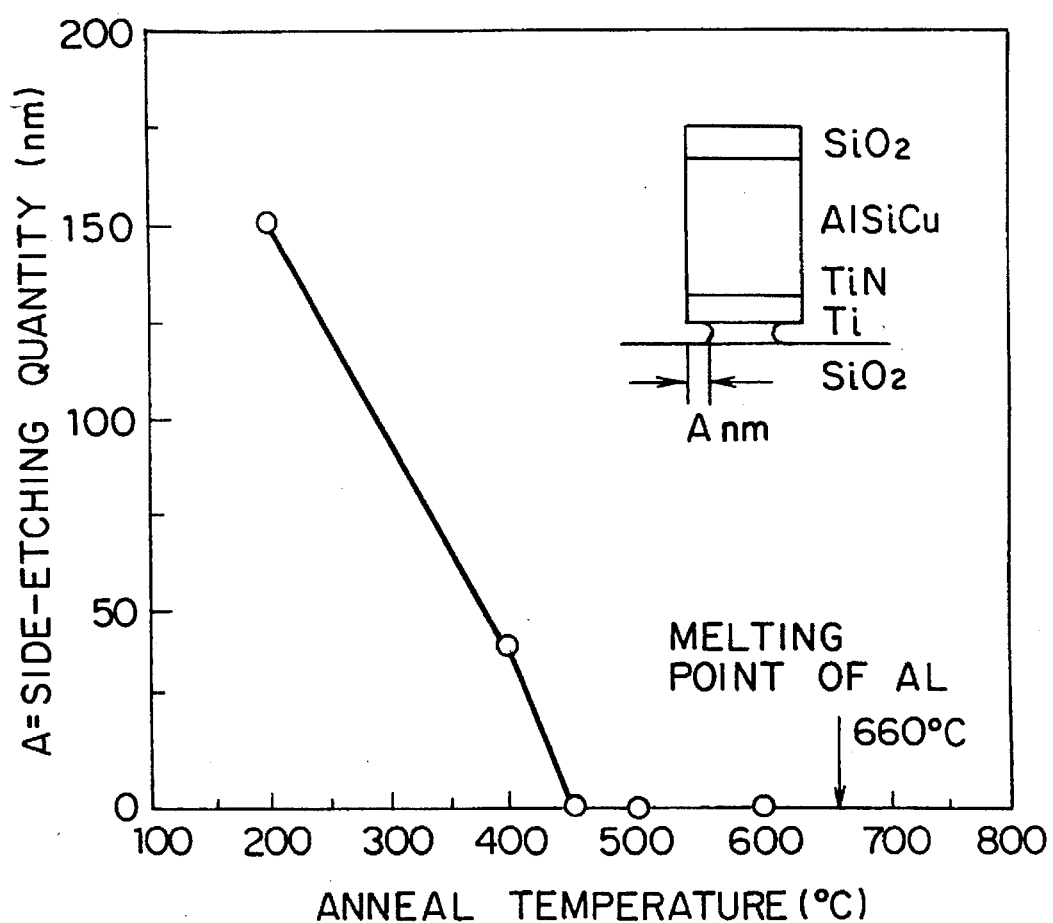
FIG. 4 is a graph showing an annealing temperature dependence of a side-etching quantity in a Ti film.

FIG. 4 indicates an annealing temperature dependence of side-etching quantity in a Ti film during the PE-CVD step employed for each of embodiments described above. It will be understood from FIG. 4 that a suppressing effect on the side-etching begins when an annealing temperature exceeds 200° C. and an enough suppression effect is obtained beyond 450° C. It is preferable to select a temperature range between 450° and 600° C. for annealing, taking into consideration situation that the melting point of the Al film is 660° C.

Figure 5:
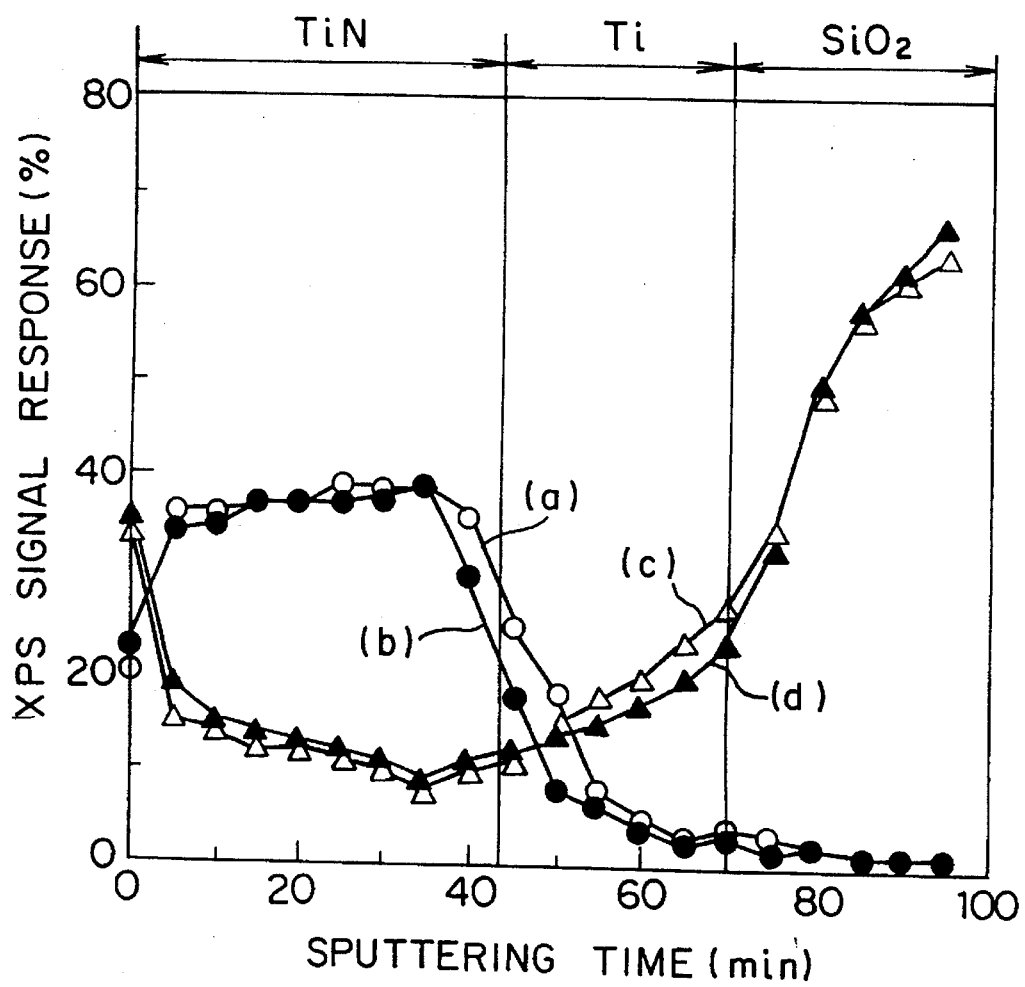
FIG. 5 is a depth profile of atomic distribution in a conductive film fabricated by a method according to the present invention.

Moreover, the introduction of the nitrogen and oxygen atoms into the Ti film induced by the heat treatment described above are evaluated using an X-ray photo-emission spectroscopy (XPS). FIG. 5 shows analytical results of the XPS. The abscissa denotes a sputtering time period during XPS analysis which corresponds to a film thickness. The ordinate denotes an XPS signal intensity in per cent (%).

Curve (a) represents a nitrogen depth profile in a conductive laminate of a semiconductor device which is subjected to a lamp annealing step at 600° C. and formed by a method according to the second embodiment of the present invention while curve (b) is a nitrogen profile in a similar device in which the 600° C. annealing step is omitted. The result that curve (a) is located higher than curve (b) in Ti film 203 verifies that nitrogen atoms are introduced from TiN film 204 into Ti film 203 during the 600° C. annealing.

Curve (c) represents a depth profile of oxygen atoms in a conductive layer of the same device as curve (a) which is subjected to the 600° C. annealing step while curve (d) is the oxygen depth profile of the same device as curve (b) in which the annealing step is omitted. The result that curve (c) is located higher than curve (d) verifies that the 600° C. annealing step diffuses oxygen atoms out of the oxide film 202 into the Ti film 203. Those nitrogen and oxygen atoms suppress the side-etching of Ti film 203.

In the embodiments described above, the growth temperature of the SiO$_2$ film 206 used as a mask for etching the conductive laminate can be lowered because the heat treatment is pursued additionally just prior to the step for forming the Al alloy film. As a result, Si precipitates segregated out of the solute resolved in a metallic solid solution of the main conductor is suppressed during formation of the SiO$_2$ film 206 even if the Al—Si—Cu film is used instead of the Al—Cu film in the second embodiment. Consequently, residues accompanying with patterning a conductive laminate to form an interconnection pattern, which are known as Si precipitates, can be avoided even when an Al—Si—Cu film is formed on a Ti film. Hence, a precipitate-induced degradation in an interconnection reliability is prevented.

The method according to the present invention can provide an interconnection pattern having a precise dimension which a conventional method fails to obtain. It is because nitrogen atoms, incorporated into a Ti film contacting with a TiN film by a heat treatment prior to a step for plasma-etching in a gaseous ambient including chlorine atoms, can suppress a side-etching of the Ti Film. By-product formed during the step for patterning a conductive laminate to form an interconnection has a higher etch-rate due to a higher volatility thereof, which guarantees a higher reliability in a device lifetime and a higher productivity in IC production.

Although the present invention is described with reference to the preferred embodiments, the present invention is not limited to such embodiments and it will be obvious for those skilled in the art that various modifications or alterations can be easily made based on the above embodiments within the scope of the present invention.

What is claimed is:

1. A method for forming an interconnection in a semiconductor device including steps of: forming a conductive laminate overlying a substrate and including a Ti film and a TiN film in direct contact with each other; annealing said conductive laminate to introduce at least nitrogen atoms from said TiN film to said Ti film; and dry-etching said conductive laminate after said annealing.

2. A method for forming an interconnection in a semiconductor device as defined in claim 1 wherein said annealing is conducted at a substrate temperature not lower than 200° C.

3. A method for forming an interconnection in a semiconductor device as defined in claim 1 wherein said annealing is conducted at a substrate temperature not lower than 450° C.

4. A method for forming an interconnection in a semiconductor device as defined in claim 1 wherein said conductive laminate further includes one of an Al film and an Al alloy film in direct contact with said TiN film.

5. A method for forming an interconnection in a semiconductor device as defined in claim 4 wherein said Al alloy film contains one of Al—Cu and Al—Si—Cu.

6. A method for forming an interconnection in a semiconductor device as defined in claim 4 wherein said annealing is conducted at a substrate temperature between 450° and 600° C.

7. A method for forming an interconnection in a semiconductor device as defined in claim 4 wherein said conductive laminate further includes a silicon oxide film in direct contact with said Ti film and wherein oxygen atoms are further introduced from said silicon oxide film to said Ti film during said annealing.

8. A method for forming an interconnection in a semiconductor device as defined in claim 1 further including a step for forming a silicon oxide film in direct contact with said Ti film before said annealing, wherein oxygen atoms are further introduced from said silicon oxide film to said Ti film during said annealing.

9. A method for forming an interconnection in a semiconductor device as defined in claim 8 wherein said annealing is conducted by a lamp annealing.

10. A method for forming an interconnection in a semiconductor device as defined in claim 1 wherein said dry-etching is conducted in a plasma containing chlorine.

* * * * *